United States Patent [19]

Frazier

[11] Patent Number: 5,829,009
[45] Date of Patent: Oct. 27, 1998

[54] METHOD AND DEVICE FOR STORING AND RECALLING INFORMATION IMPLEMENTING A KANERVA MEMORY SYSTEM

[75] Inventor: Gary A. Frazier, Garland, Tex.

[73] Assignee: Texas Instruments Incorporated, Dallas, Tex.

[21] Appl. No.: 1,474

[22] Filed: Jan. 7, 1993

[51] Int. Cl.[6] .................................................. G06F 12/00
[52] U.S. Cl. .............................. 711/100; 711/5; 711/153; 711/154
[58] Field of Search .................... 395/425; 364/200 MS, 364/900 MS; 711/5, 100, 128, 153, 154

[56] References Cited

PUBLICATIONS

"Notes on Implementation of Sparsely Distributed Memory" by Keeler et al, Aug. 7, 1986, Research Institute for Advanced Computer Science, pp. 1–22.
"Kanerva's Sparse Distributed Memory: An Associative Memroy Algorithm Well–Suited to the Connection Machine" by Rogers, International Journal Of High Speed Computing, vol. 1, No. 2 (1989) pp. 349–365.
"Configurable Sparse Distributed Memory Hardware Implementation" by Lindell et al, 1991 IEEE International Symposium on CRTs & Systems, pp. 3078–3081 vol. 5.
"VLSI Architectures of Sparse Distributed Memory" by Saarinen et al 1991 IEEE International Symposium on CRTs & Systems, pp. 3074–3077 vol. 5.

*Primary Examiner*—Tod R. Swann
*Assistant Examiner*—Toan V. Thai
*Attorney, Agent, or Firm*—Robby T. Holland; Richard L. Donaldson

[57] ABSTRACT

A memory device implementing a Kanerva memory system is provided having an address space (12) and key addresses (14) therein. The key addresses (14) partition the address space (12) such that a hypersphere (17) defined by a radius of capture (16) for each key address (14) does not overlap a hypersphere (17) of any other key address (14). By such partitioning, at most one key address (14) can be activated during a read or write operation. Each key address (14) has an address decoder (24) determining if an input address falls within the hypersphere (17) of the key address (14). If so, the key address (14) is activated and a memory element (26) within each key address (14) stores the address data within multiple bit binary counters (28) by incrementing upon storing a binary 1 and decrementing upon storing a binary 0 during a write operation. In read mode, the contents of multiple bit binary counters (28) are transferred out of the memory device (10).

5 Claims, 4 Drawing Sheets

METHOD AND DEVICE FOR STORING AND RECALLING INFORMATION IMPLEMENTING A KANERVA MEMORY SYSTEM

TECHNICAL FIELD OF THE INVENTION

This invention relates in general to memory devices and more particularly to a method, device, and device architecture for storing and recalling information implementing a Kanerva memory system.

BACKGROUND OF THE INVENTION

The Kanerva memory system is a potentially fast random access memory that uses very long addresses, ranging from 100 to 1000 bits, to store and retrieve information. The most important characteristic of a Kanerva memory is that information storage is address associative, i.e., similar applied addresses retrieve similar stored data patterns. Data stored at one address can be retrieved by reading the memory at a similar address.

During a memory read operation, many addresses activate in response to a read request. Each activated address outputs its contents and the many output values are processed to produce a single, best-average memory value. However, the read operation creates a contention among the activated address locations. Standard hardware embodiments of memory devices are unable to resolve internal contentions within a Kanerva memory system. It is thus desirable to implement a Kanerva memory system within standard memory devices, while avoiding contention resolution within the devices.

From the foregoing, it may be appreciated that a need has arisen for a memory device which implements a Kanerva memory system. Also, a need has arisen to reduce the circuitry within a single memory chip by eliminating processing address contentions within the memory chip.

SUMMARY OF THE INVENTION

In accordance with the present invention, a method and device for storing and recalling information implementing a Kanerva memory system are provided which substantially eliminate or reduce disadvantages and problems associated with prior memory devices.

The present invention includes an N-dimensional address space for holding address associative information. The volume of the address space is partitioned by a plurality of key addresses, each key address lying at the center of a hypersphere of a given radius of capture such that all addresses falling within this hypersphere are associated with the key address. The hypersphere centered on each key address represents a contiguous subset of all possible addresses within a metric distance less than or equal to the radius of capture for the hypersphere. The address space is partitioned by the location and radius of capture of the key addresses such that no two hyperspheres overlap, forcing information associated with the address space to be associated with at most one key address. Each key address has a corresponding address decoder to individually activate each key address if an input address falls within the radius of capture of its corresponding hypersphere. Information is stored within a plurality of bit counters corresponding to each key address. The bit counters are decremented upon storing a binary 0 and incremented upon storing a binary 1 when writing information into the hypersphere. In a read mode, the values of the bit counters are output from the address space upon activation of a corresponding key address.

The present invention provides various technical advantages over other memory devices within the prior art. For example, one technical advantage is to eliminate key address contentions within the memory device. Another technical advantage is to increase the speed and reduce the size of the device by removing the contention circuitry from individual memory chips. Other technical advantages are readily apparent to one skilled in the art from the following descriptions, figures, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
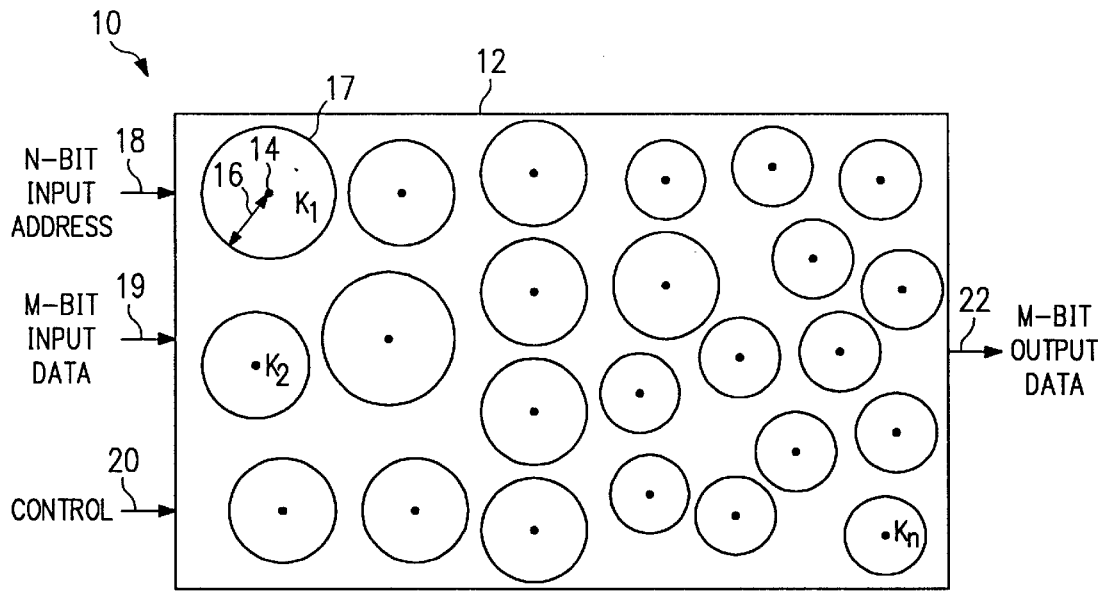
FIG. 1 illustrates an address space within a Kanerva memory device.

FIG. 1 illustrates a block diagram of a Kanerva memory device 10 of the present invention. Memory device 10 has an address space 12 with a plurality of identified key addresses 14 represented as $K_1, K_2, \ldots, K_N$. Each key address 14 has a radius of capture 16 partitioning address space 12 into a set of N-dimensional hyperspheres 17. Memory device 10 receives address information over an N-bit input address signal path 18, data information over an M-bit input data signal path 19, and operating mode information over a control signal path 20. Memory device 10 transmits information over an M-bit output data signal path 22. Each key address 14 and corresponding hypersphere 17 partition address space 12 such that any one key address 14 and corresponding hypersphere 17 does not overlap any other key address 14 or hypersphere 17.

In operation, memory device 10 receives an input address over input address signal path 18 and activates the key address 14 having a hypersphere 17 encompassing the input address. The radius of capture 16 sets the size of hypersphere 17 and represents a Hamming distance from key address 14. The Hamming distance is the number of bit positions in which two N-bit binary vectors differ. If key address $K_1$ has a radius of capture of 1, then $K_1$ activates in response to an input address which has 1 or no bit positions different from key address $K_1$.

During a write mode, as set by control signal path 20, activated key address 14 stores information received by memory device 10 over input data signal path 19. During a read mode, activated key address 14 places information stored therein onto output data signal path 22 for transmission from memory device 10. The non-overlapping partitioning of address space 12 ensures that at most one key address 14 activates in response to any input address received by memory device 10. An input address during a read or write mode which does not fall within the hypersphere of any key address will not activate memory device 10 and no associated information will be stored or retrieved.

Figure 2:
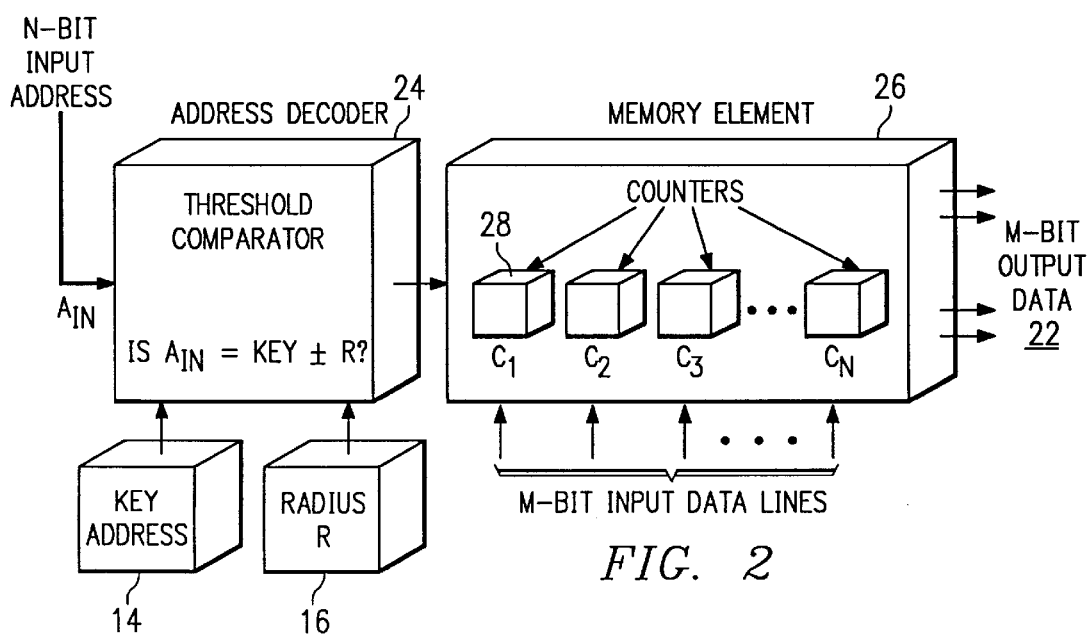
FIG. 2 illustrates a block diagram of a key address within the memory device.

FIG. 2 illustrates a block diagram of elements that physically embody a key address 14. Each key address 14 has an address decoder 24 coupled to a memory element 26. Memory element 26 has a plurality of multiple bit binary counters 28 used to store information for memory device 10. In operation, address decoder 24 compares the input address received by memory device 10 over input address signal path 18 to key address 14 and radius of capture 16. If the input address falls within the minimum Hamming distance as defined by the radius of capture 16 of key address 14, address decoder 24 activates memory element 26. During a read operation, memory element 26 outputs a value from each multiple bit binary counter 28. During a write operation, multiple bit binary counters 28 within memory element 26 increment upon storing a binary 1 and decrement upon storing a binary 0. The number of multiple bit binary counters 28 within memory element 26 corresponds to the number of bit positions of address associative information to be stored within memory device 10. In other words, each multiple bit binary counter 28 corresponds to a separate bit position of the data word received by memory device 10 over input data signal 19. The bit size of each counter is arbitrary, but may be on the order of 8 bits so that each counter can represent numbers −128 to 127.

Figure 3:
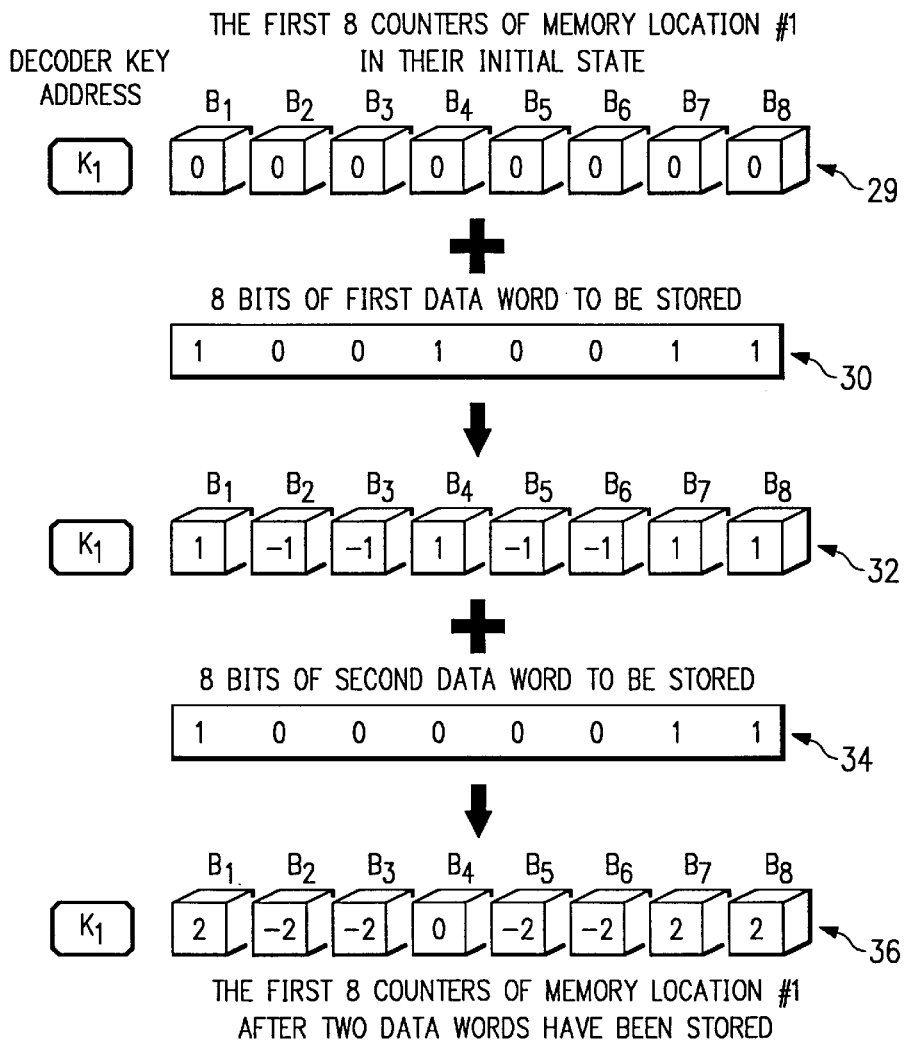
FIG. 3 illustrates operation of bit counters corresponding to a key address.

FIG. 3 illustrates operation of multiple bit binary counters 28 for storing information within memory device 10. Though FIG. 3 depicts the specific situation of a data word length of 8 bits and thus 8 multiple bit binary counters, memory device 10 is not limited in the number of bit positions of an input address word, input data word, or corresponding number of multiple bit binary counters. For simplicity sake, multiple bit binary counters 28 are shown having decimal values rather than binary values. Initially, contents 29 of bit counters $B_1$ through $B_8$ are erased to values of 0. Upon receiving an input address and write command, address decoder 24 activates a key address 14, in this case $K_1$. A data word 30 is applied to bit counters $B_1$ through $B_8$ wherein each bit counter corresponds to a separate bit position of data word 30. All binary 1's within data word 30 cause the contents for each corresponding bit position to increment by 1 and all binary 0's of data word 30 cause the contents for each corresponding bit position to decrement by 1, thus producing contents 32. The increment/decrement procedure continues upon receiving a second address, activating $K_1$ key address 14, and applying data word 34 to contents 32 of bit counters $B_1$ through $B_8$ resulting in new contents 36.

Figure 4:
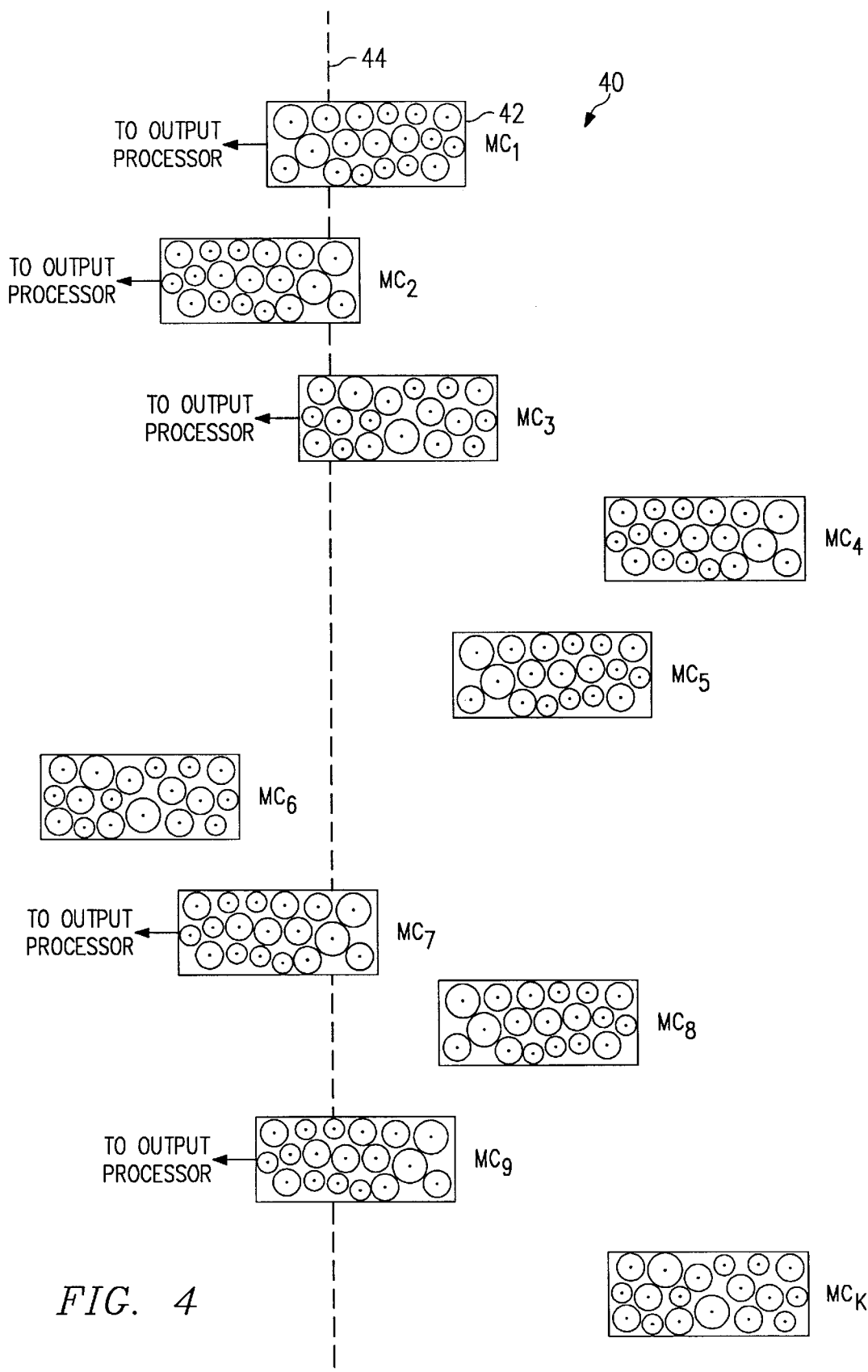
FIG. 4 illustrates a plurality of memory chips forming a memory array.

FIG. 4 illustrates a block diagram of a memory array 40. Memory array 40 comprises a number of memory chips 42 represented by $MC_1$, $MC_2$, . . . , $MC_K$. Each memory chip 42 has an address space and key addresses, each having a radius of capture defining a hypersphere as previously described above. In establishing memory array 40, random selection of key addresses can be used to uniformly partition the address space within each memory chip 42. No overlapping is allowed to occur among each key address and corresponding hypersphere within a memory chip 42 during the partitioning process. If during random generation of key addresses an overlap occurs, then that most recently generated key address is placed within a separate memory chip 42. Alternatively, the radius of capture of the overlapping key addresses can be reduced until the overlap is eliminated. Though no overlapping can occur within a memory chip 42, overlapping is possible and highly desirable between memory chips 42. Each memory chip 42 establishes a corresponding portion of the total address space for memory array 40.

During a write operation, each memory chip 42 compares the input address to each key address and determines whether the input address falls within a particular hypersphere for activation of a key address within each memory chip 42. Information is then stored into each memory chip 42 having an activated key address 14. Because overlap occurs between memory chips 42, information can be stored into more than one memory chip 42. During a read operation, each memory chip 42 having an activated key address 14 outputs the contents of multiple bit binary counters 28 corresponding to the activated key address 14.

Using FIG. 4 as an example, an input address 44 activates a key address 14 on each of memory chips 42 represented by $MC_1$, $MC_2$, $MC_3$, $MC_7$, and $MC_9$. Memory chips $MC_1$, $MC_2$, $MC_3$, $MC_7$, and $MC_9$ output their contents of the corresponding multiple bit binary counters 28 within each activated key address 14. The five separate outputs produced by memory chips $MC_1$, $MC_2$, $MC_3$, $MC_7$, and $MC_9$ establish a contention within memory array 40. Resolving contentions due to the multiple outputs requires separate processing circuitry within memory array 40. No contention resolving circuitry is required within each memory device 42.

Figure 5:
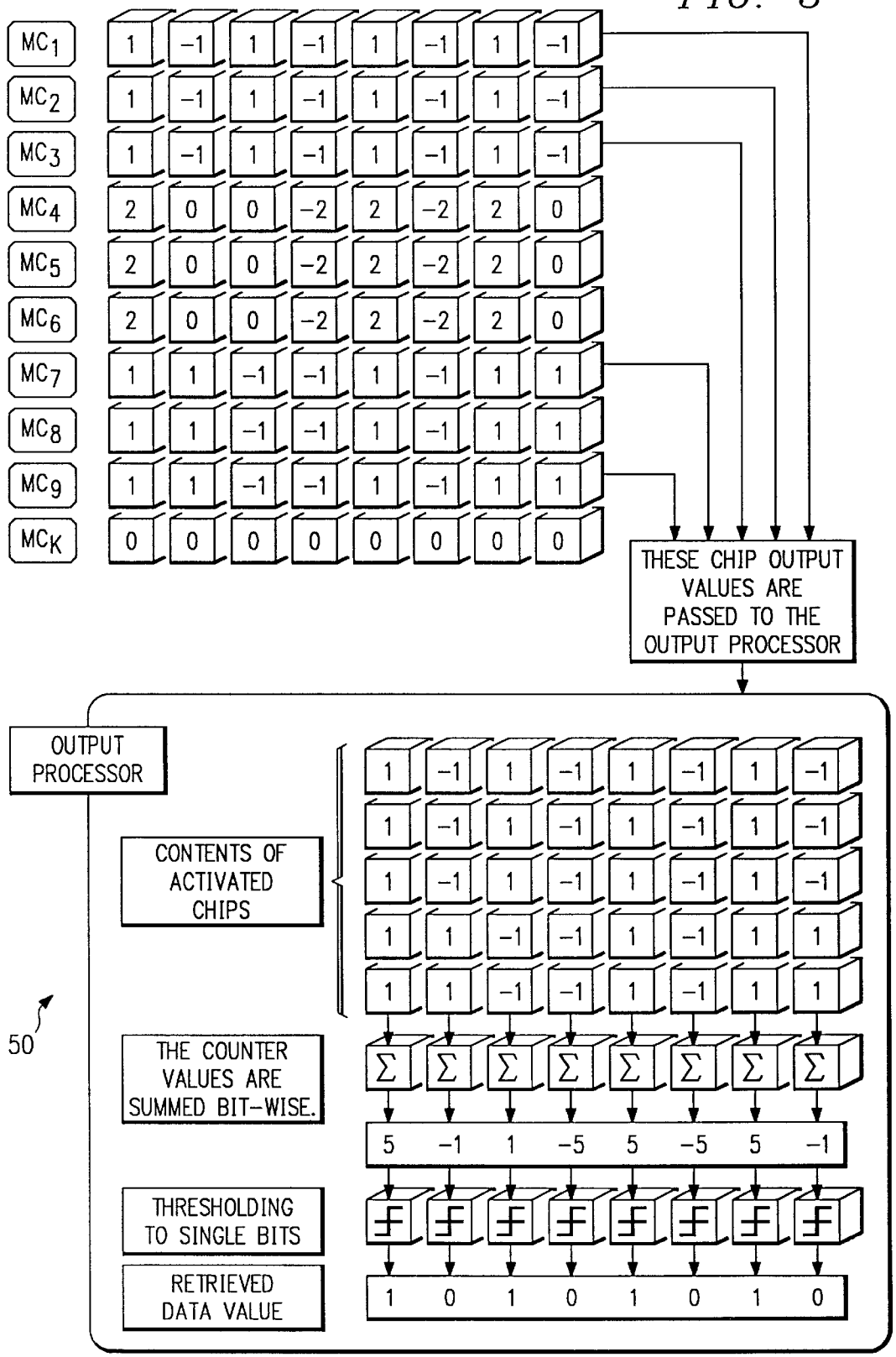
FIG. 5 illustrates a functional block diagram showing operation of an output processor for the memory array.

FIG. 5 illustrates operation of an output processor 50 for resolving the contention when two or more memory chips have an activated key address during a read operation. Memory chips having activated key addresses output the contents of their bit counters corresponding to the activated key address to output processor 50. Continuing with the example of FIG. 4, memory chips $MC_1$, $MC_2$, $MC_3$, $MC_7$, and $MC_9$ have activated key addresses corresponding to the input address 44. The contents of the multiple bit binary counters within each activated key address for memory chips $MC_1$, $MC_2$, $MC_3$, $MC_7$, and $MC_9$ are transferred to output processor 50 where the counter values from the five chips are summed bit wise, generating an overall value for each bit position of the input address word through summation of corresponding multiple bit binary counters. Next, output processor 50 performs a thresholding function on the resulting bit positions. Bit positions having a positive result are thresholded to a logic 1 level and bit counters having a negative result are thresholded to a logic 0 level. The resulting thresholded data becomes the data retrieved from memory array 40.

In summary, a Kanerva memory scheme is implemented within a memory chip such that at most one key address is activated whenever information is written to or read from the memory chip. Multiple memory chips are collected in an array to produce a memory array increasing the number of key addresses within the Kanerva memory address space. Contentions need only be resolved between chips through external summation and thresholding of bit counter contents. No contentions occur within a single memory chip due to the non-overlapping of key addresses and radii of capture partitioning the address space within the memory chip.

Thus, it is apparent that there has been provided, in accordance with the present invention, a method and device for storing and recalling information that fully satisfies the advantages set forth above. Although the preferred embodiment has been described in detail, it should be understood that various changes, substitutions, and alterations can be made therein. For example, although the preferred embodiment employed separate address and data signals, it is clear that the address and data signals can be made identical by making the number of address and data bits identical and by connecting the data path to the address path. In this configuration, the address signals also become the information stored and retrieved from the Kanerva Memory System.

Since similar input addresses activate similar key addresses, the modified embodiment produces an associative memory where similar key addresses store and retrieve similar addresses. Also, though described with multiple bit binary counters, the memory elements may contain other types of counters or devices that can increment and decrement. Similar changes may be made without departing from the spirit and scope of the present invention as defined by the following claims.

What is claimed is:

1. A device for storing and recalling information comprising:

an address space, defined by a plurality of memory chips, for holding address associative information;

a radius of capture corresponding to each key address, said key addresses partitioning said address space such that a hypersphere defined by said radius of capture of each key address does not overlap any other hyperspace within each memory chip in order to allow information within said address space to be associated with at most one key address;

a dedicated address decoder corresponding to each key address for receiving an address over an address signal path in order to activate said key address;

a memory element corresponding to each key address for storing said address associative information; wherein each memory element includes a plurality of multiple bit binary counters, each multiple bit binary counter corresponding to a separate bit position of information stored at each key address; and wherein each memory chip has a plurality of key addresses partitioning said address space such that said hyperspheres corresponding to each key address do not overlap a hypersphere of any other key address within each memory chip in order to allow information to be associated with at most one key address per memory chip.

2. The device of claim 1, further comprising:

summing circuitry for adding outputs generated by multiple memory chips at each bit position of information to determine a result for each bit position in response to a read command and activation of corresponding key addresses.

3. The device of claim 2, further comprising:

threshold circuitry for converting said result for each bit position to a binary number corresponding to information stored within said plurality of memory chips.

4. A method of storing and recalling information comprising the steps of:

defining an address spacw within a memory chip;

randomly generating key addresses within said address space;

selecting a radius of capture for each key address;

partitioning said address space such that a hypersphere defined by said radius of capture of any key address does not overlap a hypersphere defined by said radius of capture of any other key address;

receiving address associative information:

activating a key address having at most one key address associative information, said address associative information activating at most one key address within said memory chip;

storing said address associative information at said activated key address in response to a write command;

transmitting an output from said activated key address in response to a read command, said output having bit positions corresponding to said address associative information;

summing said bit positions of said output for each activated key address on multiple memory chips to determine a result for each bit position; and wherein said partitioning further comprises the step of:

placing a key address having a hypersphere which overlaps a hypersphere of another key address within said address space of said memory chip onto another memory chip in order to establish a memory array with no overlapping hyperspheres.

5. A method of storing and recalling information, comprising the steps of:

defining an address spacw within a memory chip;

randomly generating key addresses within said address space;

selecting a radius of capture for each key address;

partitioning said address space such that a hypersphere defined by said radius of capture of any key address does not overlap a hypersphere defined by said radius of capture of any other key address;

receiving address associative information;

activating a key address having at most one key address associative information, said address associative information activating at most one key address within said memory chip;

storing said address associative information at said activated key address in response to a write command;

transmitting an output from said activated by address in response to a read command, said output having bit positions corresponding to said address associative information;

summing said bit positions of said output for each activated key address on multiple memory chips to determine a result for each bit position; and eliminating overlaps of the hyperspheres of key addresses by reducing the radius of capture of said key addresses.

* * * * *